United States Patent
Weiss

(10) Patent No.: US 7,249,954 B2
(45) Date of Patent: Jul. 31, 2007

(54) SEPARABLE ELECTRICAL INTERCONNECT WITH ANISOTROPIC CONDUCTIVE ELASTOMER FOR TRANSLATING FOOTPRINT

(75) Inventor: Roger E. Weiss, Foxboro, MA (US)

(73) Assignee: Paricon Technologies Corporation, Fall River, MA (US)

( * ) Notice: Subject to any disclaimer, the term of this patent is extended or adjusted under 35 U.S.C. 154(b) by 0 days.

(21) Appl. No.: 11/457,849

(22) Filed: Jul. 17, 2006

(65) Prior Publication Data

US 2007/0015375 A1 Jan. 18, 2007

Related U.S. Application Data

(63) Continuation-in-part of application No. 10/374,698, filed on Feb. 26, 2003, now Pat. No. 7,077,659.

(60) Provisional application No. 60/359,618, filed on Feb. 26, 2002.

(51) Int. Cl.
*H01R 12/00* (2006.01)
(52) U.S. Cl. ...................................................... 439/66
(58) Field of Classification Search ................... 439/66, 439/91, 591, 531
See application file for complete search history.

(56) References Cited

U.S. PATENT DOCUMENTS

| | | | |
|---|---|---|---|
| 4,003,621 A | 1/1977 | Lamp | |
| 4,820,376 A | 4/1989 | Lambert et al. | |
| 4,969,828 A | 11/1990 | Bright et al. | |
| 5,371,654 A | 12/1994 | Beaman et al. | |
| 5,618,189 A | 4/1997 | Jin et al. | |
| 5,672,978 A | 9/1997 | Kimura | |
| 5,829,988 A | 11/1998 | McMillan et al. | |
| 6,019,610 A | 2/2000 | Glatts | |
| 6,027,346 A | 2/2000 | Sinsheimer et al. | |
| 6,069,024 A | 5/2000 | Murakami | |
| 6,097,609 A | 8/2000 | Kabadi | |
| 6,239,389 B1 | 5/2001 | Allen et al. | |
| 6,265,673 B1 | 7/2001 | Higashida et al. | |
| 6,338,629 B1 | 1/2002 | Fisher et al. | |
| 6,341,963 B1 | 1/2002 | Hussain | |
| 6,386,890 B1 | 5/2002 | Bhatt et al. | |
| 6,447,308 B1 | 9/2002 | McCarthy et al. | |
| 7,097,461 B2 * | 8/2006 | Neidlein | 439/66 |
| 7,134,881 B1 * | 11/2006 | Sakairi | 439/66 |
| 7,182,606 B2 * | 2/2007 | Ishii et al. | 439/66 |

* cited by examiner

*Primary Examiner*—Phuong Dinh
(74) *Attorney, Agent, or Firm*—Brian M. Dingman; Mirick, O'Connell, DeMallie & Lougee, LLP

(57) ABSTRACT

A separable electrical connector for electrically interconnecting an electrical device to a substrate. In one embodiment, the connector includes an adapter board electrically connected to the substrate, the adapter board having electrical contacts on both sides, and a layer of ACE between the electrical device and the adapter board. A mechanical structure is used to apply a compressive force on the ACE through the adapter board and the electrical device. In another embodiment, the connector includes a translator board having electrical contacts on both sides and electrical circuits within to expand the footprint of the fine pitch electrical device to the coarser pitch of the substrate. The connector further includes a layer of ACE between the translator board and the substrate.

5 Claims, 6 Drawing Sheets

SEPARABLE ELECTRICAL INTERCONNECT WITH ANISOTROPIC CONDUCTIVE ELASTOMER FOR TRANSLATING FOOTPRINT

CROSS REFERENCE TO RELATED APPLICATION

This application is a continuation-in-part of, and claims priority from, U.S. patent application Ser. No. 10/374,698 entitled "Separable electrical interconnect with anisotropic conductive elastomer and a rigid adapter" filed Feb. 26, 2003 now U.S. Pat. No. 7,077,659, to Weiss et al., the entire contents of which is incorporated by reference herein, and which is based upon and claims the benefit of priority from patent application Ser. No. 09/465,056 filed Dec. 16, 1999 and U.S. provisional application No. 60/359,618 filed Feb. 26, 2002, the entire contents of which are incorporated by reference herein.

FIELD OF THE INVENTION

This invention relates to a separable electrical connector for electrically connecting an electrical device to a substrate.

BACKGROUND OF THE INVENTION

Anisotropic Conductive Elastomer (ACE) is a composite of conductive metal elements in an elastomeric matrix that is normally constructed such that it conducts along one axis only. In general this type of material is made to conduct through the thickness. In one reduction to practice, ACE achieves its anisotropic conductivity by mixing magnetic particles with a liquid resin, forming the mix into a continuous sheet and curing the sheet in the presence of a magnetic field. This results in the particles forming columns through the sheet thickness which are electrically conductive. The resulting structure has the unique property of being flexible and anisotropically conductive. These properties provide for a useful interconnection medium.

In another reduction to practice, ACE may consist of a matrix phase of an electrically insulating rubber sheet having a specified hardness and a dispersed phase of a multiplicity of metallic fine wire segments embedded in the matrix. The multiplicity of fine wire segments are substantially in parallel each with the others, and extend in a specified direction and in a specified distribution density. Each of the ends of the wire segments are exposed on the surface of the matrix sheet of rubber.

ACE must be compressed between top and bottom conductors to provide the interconnection. This is normally done by compressing the system using a backing plate and spring arrangement. One example of such is shown in FIG. 1. This requires the use of boards that are designed to accommodate the backing plate and holes. This can result in a conflict with components mounted under the device and on the back of the board.

SUMMARY OF THE INVENTION

This invention features a separable electrical connector for electrically interconnecting an electrical device to a substrate. In one embodiment, the invention comprises an adapter board electrically connected to the substrate, the adapter board having electrical contacts on both sides, a layer of ACE between the electrical device and the adapter board, and a mechanical structure for applying a compressive force on the ACE through the adapter board and the electrical device. This mechanical structure can be coupled to the adapter board rather than to the substrate.

The mechanical structure may comprise a spring plate, which is preferably removable to assist in the separability. A rotating screw member may be used for the purpose of applying the compressive load from the spring plate. The connector may further comprise a heat sink in thermal contact with the device, and through which the compressive load is applied. The connector may further comprise a thermal conducting medium between the device and the heat sink.

The connector may also further comprise a flexible circuit element between the device and the ACE. The flexible circuit element may comprise electrical contacts on both sides electrically connected together through the circuit element thickness. The connector may still further comprise an insulating backfill between the adapter and the substrate to enhance the stiffness of the adapter board. The backfill may be epoxy. The device may further comprise a second layer of ACE between the adapter board and the device.

In another embodiment, the separably removable connector includes a translator board having electrical contacts on both sides and electrical circuits within to expand the footprint of the fine pitch electrical device to the coarser pitch of the substrate. The connector further includes a layer of ACE between the translator board and the substrate. The connector may further include a second layer of ACE between the translator board and the device.

The connector may be designed to interface to the electrical device through a test socket. In this embodiment, a semiconductor is inserted in the test socket to permit semiconductors of varying footprint types to interface to the connector. The test socket may include a plurality of solder pads, where the solder pads are positioned to be aligned with corresponding conductors from the semiconductor and a plurality of corresponding internal leads for connecting the plurality of solder pads to a plurality of conductors on the bottom surface of the test socket.

BRIEF DESCRIPTION OF THE DRAWINGS

Other objects, features and advantages will occur to those skilled in the art from the following description of the preferred embodiments and the accompanying drawings, in which:

FIG. 6 is a side view of an alternative embodiment of the invention in which the footprint of an electrical device with a fine pitch is translated to the coarser pitch of a printed circuit board.

DESCRIPTION OF THE PREFERRED EMBODIMENT OF THE INVENTION

Figure 1:
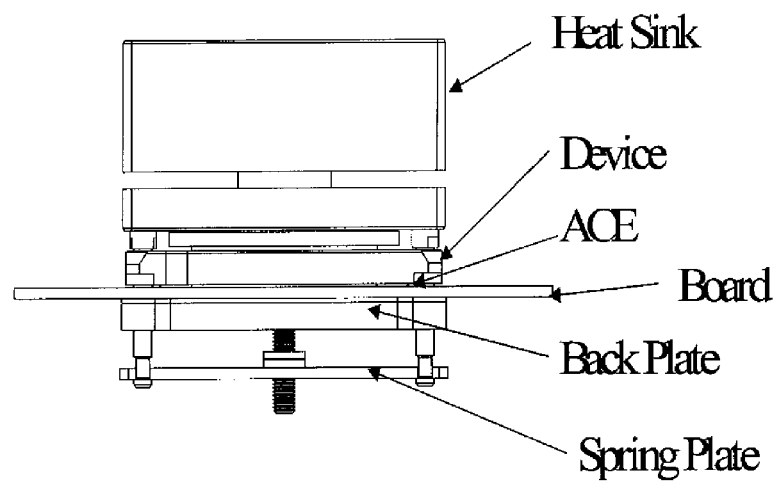
FIG. 1 is a side view of a prior art separable electrical interconnect with anisotropic conductive elastomer (ACE)
Figure 2:
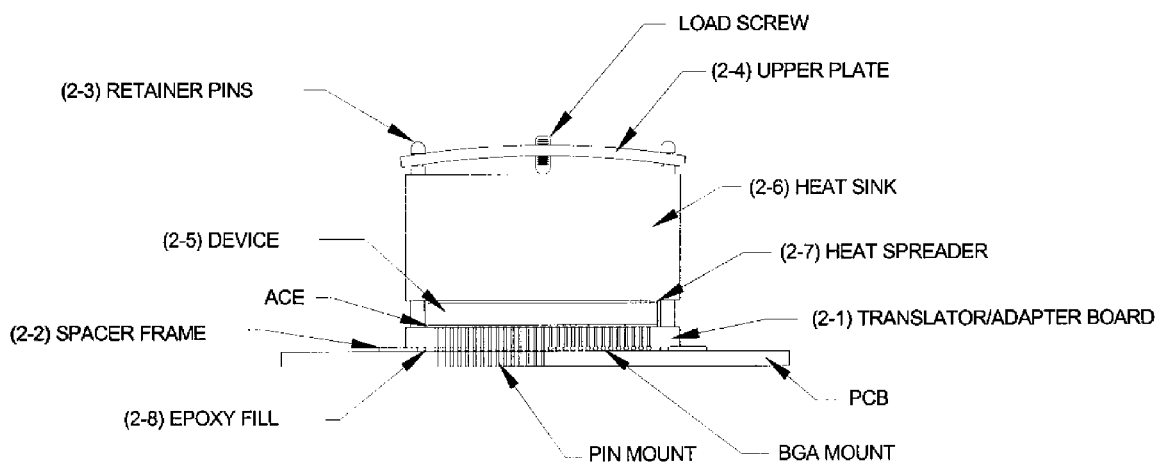
FIG. 2 is a representative side view of one embodiment of the invention.

FIG. 2 details several aspects of one preferred embodiment of the invention. The aim of the invention is to accomplish a functional and separable electrical interconnection between electrical device 32 and substrate 34, which is typically a printed circuit board. There are many uses for such a separable electrical connector. One is in a fixture to test or burn-in computer chips. This requires that the chips be quickly and easily electrically connected to a board, and then removed and replaced with another chip after the appropriate test. Also shown in this drawing (for illustration purposes only) are two different types of typical electrical device output interconnection structures-ball grid array 50 and pin array 52. Typically, one or the other of these two would be used, never both. Both are illustrated to show that the device can accommodate either type of connection hardware.

The invention contemplates placing a relatively rigid adapter board 36 between device 32 and substrate 34. Board 36 is permanently electrically and mechanically connected to printed circuit board 34, typically using in the above-mentioned ball grid array mount or pin mount technology. Board 36 then acts as both a mechanical support and an electrical interconnect between electrical device 32 and printed circuit board 34.

One aspect of board 36 is that it accomplishes an electrical interface to both printed circuit board 34 and ACE layer 38, and can also be designed to more efficiently electrically interface with both the printed circuit board and ACE layer. In other words, board 36 can be used to rearrange the pattern of electrical contacts on printed circuit board 34 to better match those on device 32, and also to more efficiently interface with ACE material 38. For example, adapter 36 can provide a mechanical translation from the BGA solder format or the pin format typically used in a printed circuit board, to the flat land format that is optimally used for ACE material. ACE material performs best when there is a flat, relatively large interconnect on its faces that can electrically connect to a number of conductive paths through the ACE. BGA and pin arrays have a relatively small contact area that is not ideally suited for interfacing with ACE material. Translator 36 can achieve this goal by having flat lands on its upper surface where it interfaces with ACE material 38, and then pins or BGA connectors on the bottom surface where it interfaces with the receiving structures on the surface of printed circuit board 34.

Another function of adapter 36 is to provide increased rigidity to the assembly, to allow the necessary ACE material compression structures to be located exclusively or at least primarily on the upper side of printed circuit board 34. Additionally, this hardware can be interfaced primarily or exclusively to translator 36, rather than to printed circuit board 34, and also without the need for the hardware to pass through printed circuit board 34. All of these contribute to the separable connector of this invention interfering less with the primary function of printed circuit board 34 and the components mounted thereon, making the invention a preferred separable electrical connector.

These mechanical features are accomplished as follows. Board 36 can be made of an appropriately rigid insulator such as epoxy or ceramic. It can contain metal members or other stiffeners to provide additional stiffness. The stiffness can be further increased by including a frame member 40 that rests around the periphery of adapter board 36 and against circuit board 34. This frame will thicken the adapter and provide additional stiffness. Alternatively, the adapter could be made in this overall configuration.

Adapter 36 serves as the platform for the compressive interconnection between the ACE material 38 and electrical device 32. This is accomplished in the embodiment shown in the drawing by including retainer pins 46 around the periphery of adapter 36. These couple an upper spring plate 44 to adapter 36, to provide the compressive force needed to electrically couple ACE layer 38 to both device 32 and adapter 36. In the embodiment shown, heat sink 42 is located between plate 44 and device 32 to act to both draw heat from the device and also mechanically couple the compressive load from plate 44. Heat spreading material 56 can be included to provide better heat transfer into heat sink 42. Load screw 48 is an adjustable set screw that allows adjustment of the compressive force provided by spring plate 44 as necessary to achieve a desired compressive force.

This arrangement decouples the ACE compression mechanical elements from printed circuit board 34. Accordingly, the inherent separability of ACE material can be accomplished without having an impact on other components that are mounted to either the front or back surface of printed circuit board 34. Also, this arrangement places little stress on the solder joint interconnecting adapter 36 with printed circuit board 34. Additional stiffness to this joint can be accomplished by adding or injecting an insulating underfill material 54 between the bottom of adapter 36 and the top of printed circuit board 34 to encapsulate the solder joints and bond the two boards together. This underfill could be an epoxy material that can flow around the joints and then harden in place.

Figure 3:
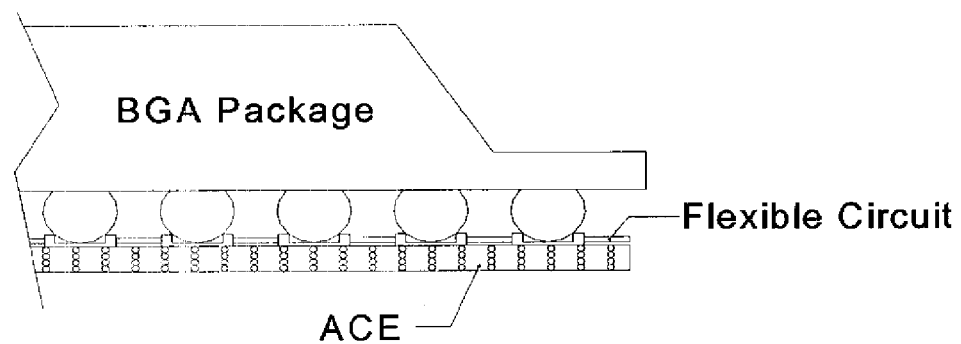
FIG. 3 is a greatly enlarged partial cross-sectional view of an electrical device electrically coupled to an ACE layer according to one embodiment of the invention.

As stated above, ACE material is best electrically coupled with flat lands rather than the solder balls of a ball grid array. The interface between a ball grid array and ACE material can be enhanced as shown in FIG. 3. Ball grid array electrical package 70 has solder balls such as ball 71 that electrically interface with ACE material 72 having conductive elements 80 through its thickness. Since solder balls accomplish only a small area contact, there is opportunity for contact with only a small number of the thin conductive elements of the ACE. Electrical connection is enhanced by maximizing the contact surface area between the device and the ACE material. This can be accomplished through the use of an intervening flexible circuit element 74 that has flat lands 78 on its bottom side to interface with ACE material 80, and plated through holes 76 open to the front side that are adapted to receive a ball 71. These large radius plated holes on the upper surface of the flex circuit will protect the bottom of the solder ball, allow it to seat naturally in its correct location, and provide electrical connectivity to lands 78 that are in contact with ACE material 72.

Figure 4:
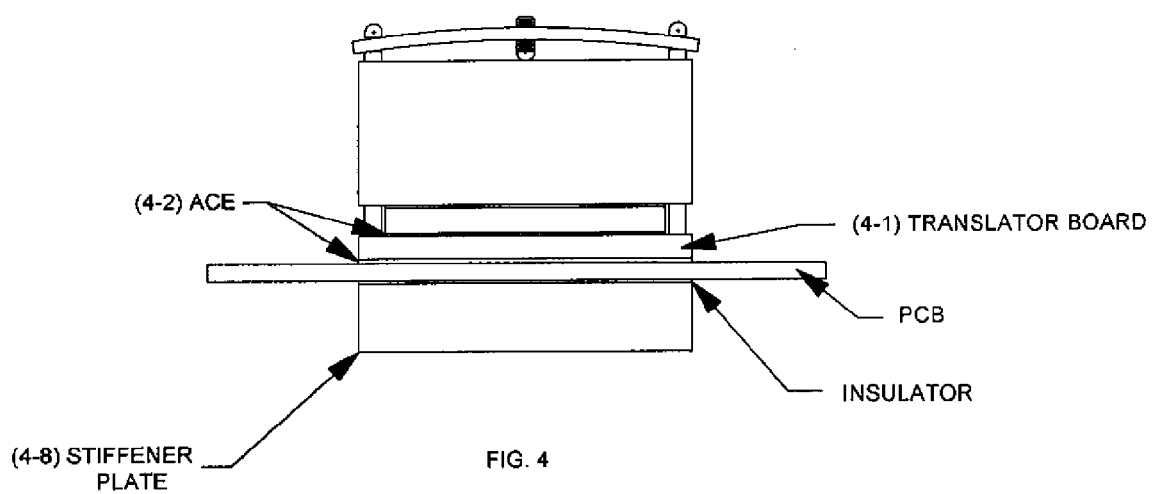
FIG. 4 is a side view of another embodiment of the invention utilizing two layers of ACE material.

Another alternative preferred embodiment is shown in FIG. 4. In this embodiment, adapter board 36 is not soldered to printed circuit board 34, but is separably connected to the printed circuit board using a second layer of ACE material 38a. Since there is no solder connection, the entire assembly can be easily disassembled. However, without the solder connection it is likely that an additional mechanical member such as stiffening plate 64 would need to be located on the underside of circuit board 34 to couple spring plate 44. This would prevent the bowing of circuit board 34 under the spring force load that may happen if spring plate 44 was coupled to board 34.

This configuration would be very useful in the test industry where the printed circuit board used is complex and costly. This would allow a universal test printed circuit board to be used that can be adapted to several different chip designs using a low cost adapter board that also accomplishes the necessary electrical translation. Layers of ACE material on both surfaces of the adapter board are an excellent means of interconnecting device 32 through board 36 to printed circuit board 34.

Figure 5:
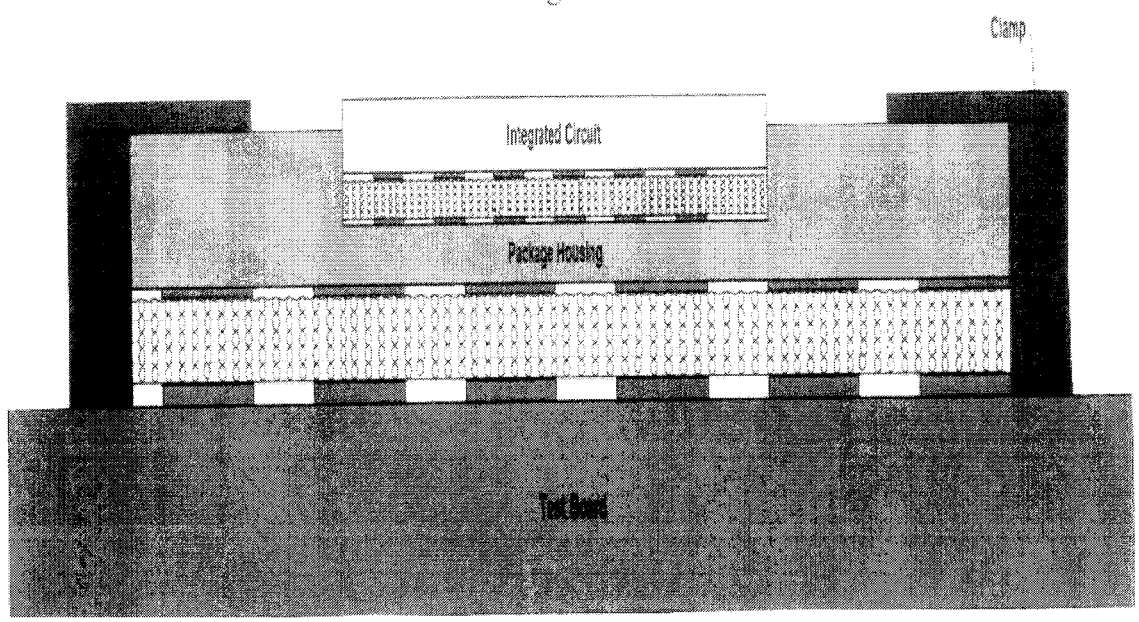
FIG. 5 is a side view of an alternative embodiment of the invention in which a layer of ACE material is used to accomplish the functionality of a complex prober system.
Figure 9:
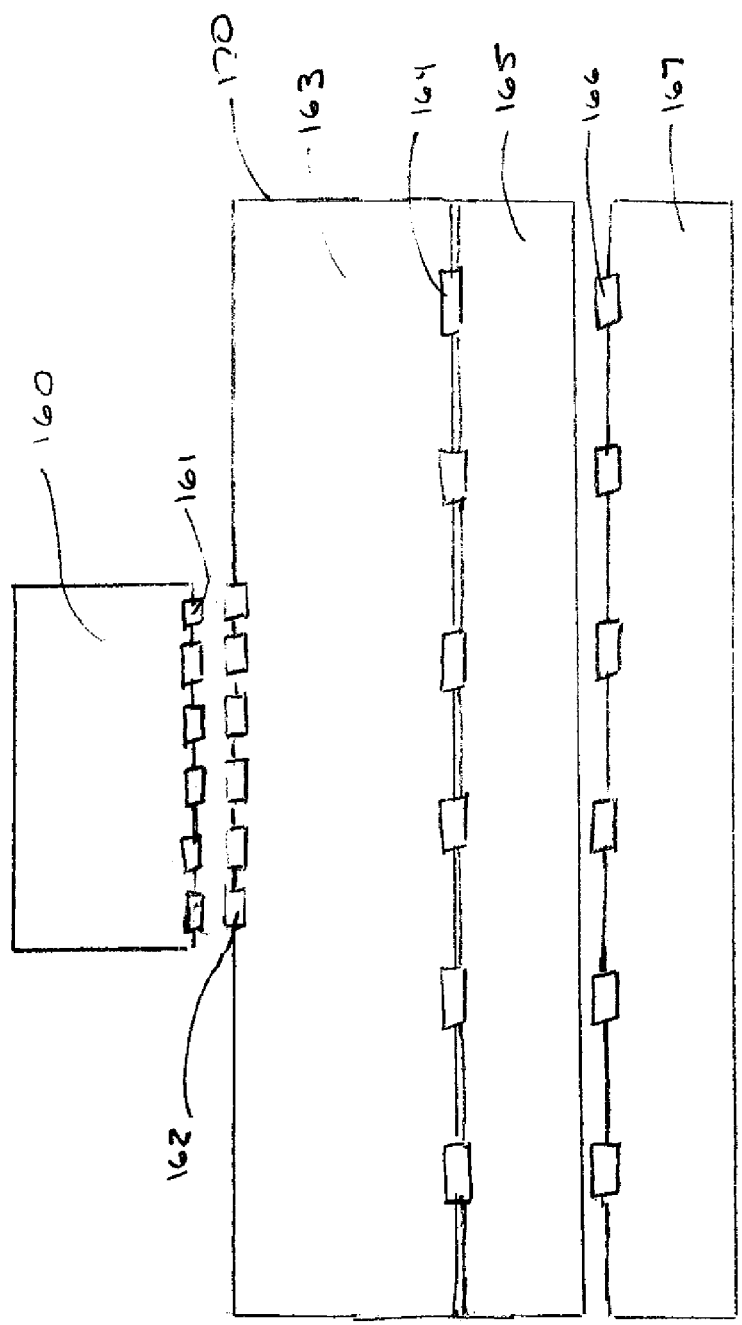

The invention also includes a means of testing electrical devices (such as an integrated circuit) as indicated in FIG. 5. A package housing 90 that does not contain an integrated circuit is interconnected to PCB 34 using a layer 94 of ACE material. The top of package housing 90 is left open by only compressing it to the ACE at the periphery or edges of the package, as illustrated by frame-shaped clamping device 100 that provides the necessary compressive force on ACE layer 94 to accomplish the electrical interconnection between package housing 90 and printed circuit board 34. Alternatively, the package housing could be permanently attached to the PCB, for example with a solder connection.

The semiconductor industry has reduced the size of semiconductor devices and simultaneously increased the density or number of contact points or conductors on a given semiconductor chip, such that the available distance or pitch between the contact points has been correspondingly reduced. Integrated circuit devices such as device 92 have conductors that are on a very fine pitch—as low as 0.2 mm and below. One purpose of package housing 90 is to provide a means of translating the high density or fine pitch of the integrated circuit to the low density or relatively coarse pitch of the PCB. In this embodiment of the invention an improved test capability is provided to a prober test system using ACE material as the prober system. ACE materials, such as those created by the magnetic alignment of fine particles, can be constructed to meet the fine pitch requirements needed for a low cost, high performance prober system. A second layer of ACE material 96 can be used between package housing 90 and integrated circuit 92, resulting in a low cost, high performance test capability without the need for a separate complex, expensive prober device between the integrated circuit and the package housing.

A further embodiment of the invention is shown in FIG. 6. In this embodiment, separably removable electrical connector 170 accomplishes at least in part an electrical interface between electrical device 160 and PCB 167, and can be designed to translate the fine pitch of electrical device 160 to the coarser pitch of PCB 167. The invention features a translator board 163 coupled to a layer of ACE material 165. Translator board 163 can be designed to provide increased rigidity to electrical connector 170, and can be constructed of multiple layers (not shown). A second layer of ACE material (not shown) can also be included between translator board 163 and electrical device 160.

Translator board 163 includes a first set of electrical contacts 162. These electrical contacts 162 can be positionally aligned with and have the same pitch as the electrical conductors 161 of electrical device 160. Electrical contacts 162 can be designed to accommodate different configurations of electrical conductors, including but not limited to ball grid array, land grid array and pin grid array. Translator board 163 further includes a second set of electrical contacts 164. These electrical contacts 164 can be positionally aligned with and have the same pitch as electrical conductors 166 of PCB 167. Translator board 163 interfaces with ACE material 165 to accomplish at least in part an electrical interface between electrical contacts 164 and electrical conductors 166 of PCB 167.

The electrical interface between electrical contacts 162 and electrical contacts 164 of translator board 163 is accomplished by electrical circuits (not shown). In one configuration, the top layer of translator board 163 includes circuit traces connecting each of the electrical contacts 162 to a corresponding contact pad. The bottom layer of translator board 163 also includes circuit traces connecting each of the electrical contacts 164 to a corresponding contact pad. The contact pads on the top layer of translator board 163 are positionally aligned with the contact pads on the bottom layer of translator board 163, and an electrical circuit is formed by electrically connecting the two sets of contact pads via concentric through holes in the layers. Other configurations, including alternate arrangements of contact pads on the top and bottom layers of the translator board, alternate means of electrically connecting the two sets of contact pads, and translator boards having more than two layers, are contemplated and within the scope of the invention.

Figure 7:
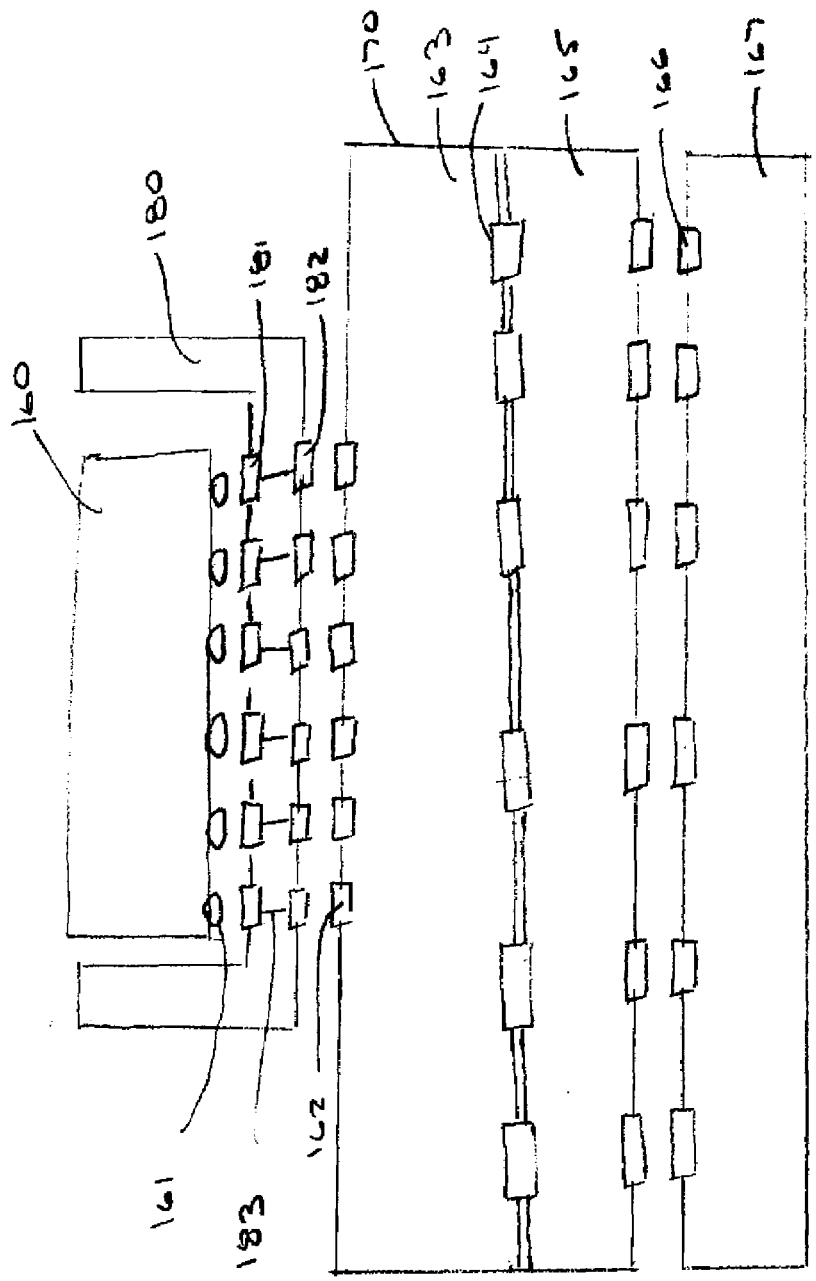
FIG. 7 is a side view of an alternative embodiment of the invention in which the footprint of an electrical device with a fine pitch and contained within a test socket is translated into the coarser pitch of a printed circuit board.

In a further embodiment, shown in FIG. 7, electrical device 160 can be removably mounted in a socket 180, where socket 180 provides an electrical interface between device 160 and translator board 163. The socket 180 can incorporate contacts such as spring contacts or can be constructed using ACE material. The socket 180 can further include means well known in the art to align electrical device 160 to translator board 163. In one configuration, socket 180 includes a plurality of solder pads 181, where solder pads 181 are positioned to be aligned with corresponding conductors 161 from device 160 and a plurality of corresponding internal leads 183 for connecting the plurality of solder pads 181 to a plurality of conductors 182 on the bottom surface of test socket 180. Other configurations of socket 180 are contemplated and within the scope of the invention.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. An apparatus for electrically coupling an electrical device to a substrate, comprising:

a translator board having a first side, a second side, a first plurality of electrical contacts, a second plurality of electrical contacts, and a plurality of electrical circuits; and a layer of anisotropic conductive elastomer (ACE) disposed between the translator board and the substrate, wherein the first plurality of electrical contacts are disposed on the first side of the translator board and are positioned to be aligned with a plurality of corresponding conductors on the electrical device, the electrical device having a first contact pitch, and the second plurality of electrical contacts are disposed on the second side of the translator board and are positioned to be aligned with a plurality of corresponding conductors on the substrate, the substrate having a second contact pitch which differs from the first contact pitch, and the plurality of electrical circuits are disposed between the first plurality of electrical contacts and the second plurality of electrical contacts and accomplish at least in part the translation from the first pitch of the electrical device to the second pitch of the substrate, and the layer of ACE accomplishes at least in part the electrical connection between the translator board and the substrate.

2. The apparatus of claim 1, where the electrical device is a semiconductor chip.

3. The apparatus of claim 1, where the electrical device is disposed within a socket, the socket accomplishing at least in part the electrical interface between the electrical device and the substrate.

4. The apparatus of claim 3, where the electrical device is removably disposed within the socket.

5. The apparatus of claim 1, where the second contact pitch is greater than the first contact pitch.

* * * * *